United States Patent
Chiang et al.

(10) Patent No.: US 8,277,617 B2
(45) Date of Patent: Oct. 2, 2012

(54) CONFORMAL MAGNETRON SPUTTER DEPOSITION

(75) Inventors: Kuang-Tsan Kenneth Chiang, Helotes, TX (US); Ronghua Wei, San Antonio, TX (US)

(73) Assignee: Southwest Research Institute, San Antonio, TX (US)

( * ) Notice: Subject to any disclaimer, the term of this patent is extended or adjusted under 35 U.S.C. 154(b) by 1102 days.

(21) Appl. No.: 11/838,399

(22) Filed: Aug. 14, 2007

(65) Prior Publication Data
US 2009/0045047 A1 Feb. 19, 2009

(51) Int. Cl.
C23C 14/00 (2006.01)
C23C 14/32 (2006.01)
C25B 9/00 (2006.01)
C25B 11/00 (2006.01)
C25B 13/00 (2006.01)

(52) U.S. Cl. ........... 204/192.15; 204/192.12; 204/192.3; 204/192.32; 204/298.08; 204/298.21

(58) Field of Classification Search ................ 204/192.1, 204/298.09, 298.21, 298.22, 298.23, 192.12, 204/192.15, 192.3, 192.32, 298.08, 298.232
See application file for complete search history.

(56) References Cited

U.S. PATENT DOCUMENTS

| | | | |
|---|---|---|---|
| 3,775,285 A | 11/1973 | Lane et al. | |
| 4,080,281 A | 3/1978 | Endo | |
| 4,126,530 A | 11/1978 | Thornton | |
| 4,179,351 A * | 12/1979 | Hawton et al. | 204/298.09 |
| 4,407,713 A * | 10/1983 | Zega | 204/298.22 |
| 4,410,407 A | 10/1983 | Macaulay | |
| 4,445,997 A * | 5/1984 | McKelvey | 204/298.23 |
| 4,478,703 A | 10/1984 | Edamura et al. | |
| 4,520,268 A | 5/1985 | Xu | |
| 4,731,539 A | 3/1988 | Xu | |
| 4,812,217 A | 3/1989 | George et al. | |
| 5,268,085 A | 12/1993 | Nelson et al. | |
| 5,427,666 A | 6/1995 | Mueller et al. | |
| 5,464,518 A | 11/1995 | Sieck et al. | |
| 5,516,403 A | 5/1996 | Forster et al. | |
| 5,527,438 A | 6/1996 | Tepman | |
| 5,557,927 A | 9/1996 | Chiang et al. | |
| 5,772,858 A | 6/1998 | Tepman | |

(Continued)

FOREIGN PATENT DOCUMENTS

JP  02251143  8/1990

(Continued)

OTHER PUBLICATIONS

International Search Report dated Nov. 5, 2007 issued in related International Patent Application No. PCT/EP2007/052374.

(Continued)

*Primary Examiner* — Jonathan Johnson
*Assistant Examiner* — Michael Band
(74) *Attorney, Agent, or Firm* — Grossman, Tucker et al

(57) ABSTRACT

An apparatus and method for magnetron sputter coating of an interior surface of a hollow substrate defining at least one irregular contour. The apparatus may contain a vacuum chamber and a target containing one or more metals having an exterior surface defining at least one irregular contour. The exterior surface of the target may be configured to conform to at least a portion of an irregular contour of the interior surface of the hollow substrate to be coated. A magnet assembly may be supplied which may include a plurality of magnets where the magnets are positioned substantially within a metallic target alloy.

3 Claims, 10 Drawing Sheets

U.S. PATENT DOCUMENTS

| | | | |
|---|---|---|---|
| 5,994,211 | A | 11/1999 | Wang et al. |
| 6,037,257 | A | 3/2000 | Chiang et al. |
| 6,042,700 | A | 3/2000 | Gopalraja et al. |
| 6,132,805 | A | 10/2000 | Moslehi |
| 6,190,511 | B1 | 2/2001 | Wei |
| 6,190,516 | B1 | 2/2001 | Xiong et al. |
| 6,204,550 | B1 | 3/2001 | Wang et al. |
| 6,299,831 | B1 | 10/2001 | Lo |
| 6,315,877 | B1 | 11/2001 | Goedicke et al. |
| 6,358,376 | B1 | 3/2002 | Wang et al. |
| 6,413,383 | B1 | 7/2002 | Chiang et al. |
| 6,498,091 | B1 | 12/2002 | Chen et al. |
| 6,663,755 | B2 | 12/2003 | Gorokhovsky |
| 6,709,553 | B2 | 3/2004 | Wang et al. |
| 6,719,883 | B2 | 4/2004 | Stimson |
| 6,730,196 | B2 | 5/2004 | Wang et al. |
| 6,740,393 | B1 | 5/2004 | Massler et al. |
| 6,758,949 | B2 | 7/2004 | Wang et al. |
| 6,767,436 | B2 | 7/2004 | Wei |
| 6,787,006 | B2 | 9/2004 | Gopalraja et al. |
| 6,863,699 | B1 | 3/2005 | Krasnov et al. |
| 7,320,331 | B1 | 1/2008 | Audino et al. |
| 7,578,908 | B2 | 8/2009 | Hockley et al. |
| 2002/0185370 | A1 | 12/2002 | Gopalraja et al. |
| 2003/0111337 | A1 | 6/2003 | Lin et al. |
| 2003/0209422 | A1 | 11/2003 | Wang et al. |
| 2004/0016635 | A1* | 1/2004 | Ford et al. ............... 204/192.1 |
| 2004/0020770 | A1 | 2/2004 | Wang et al. |
| 2004/0031680 | A1 | 2/2004 | Miller et al. |
| 2004/0045811 | A1 | 3/2004 | Wang et al. |
| 2004/0055870 | A1 | 3/2004 | Wei |
| 2005/0279630 | A1* | 12/2005 | Fonte ..................... 204/298.21 |
| 2006/0076231 | A1 | 4/2006 | Wei |
| 2006/0076235 | A1 | 4/2006 | Wei |
| 2006/0137968 | A1 | 6/2006 | Hartig |
| 2006/0177581 | A1 | 8/2006 | Chiang et al. |
| 2006/0183305 | A1 | 8/2006 | Gao et al. |
| 2006/0251872 | A1 | 11/2006 | Wang et al. |
| 2006/0251917 | A1 | 11/2006 | Chiang et al. |
| 2007/0059502 | A1 | 3/2007 | Wang et al. |
| 2008/0289957 | A1 | 11/2008 | Takigawa et al. |
| 2009/0114529 | A1 | 5/2009 | Dekempeneer et al. |
| 2010/0006421 | A1 | 1/2010 | Wei |

FOREIGN PATENT DOCUMENTS

| | | |
|---|---|---|
| JP | 4107268 | 4/1992 |

OTHER PUBLICATIONS

Xu et al., "Metal Ion Source for Metallic Surface Metallurgy," Proceedings: Tenth International Symposium on Discharges and Electric Insulation in Vacuum, pp. 368-373.

Li et al., "Diffusion Mechanism of Ion Bombardment," Surface Engineering 1987 vol. 4 No. 4 (3 pages).

Lee et al., "Electroplated and Plasma Enhanced Magnetron Sputtered Ta and Cr Coatings for High Temperature and High Pressure Operation," 2006 MRS Fall Meeting: Symposium DD—Materials Research at High Pressure, Jan. 1, 2006; Venue: Boston, Massachusetts, USA.

Xu et al., "Double glow plasma surface alloying and plasma nitriding," Surface and Coatings Technology vol. 201, Issues 9-11, Feb. 26, 2007, pp. 4822-4825.

Wei, et al., "Metal Plasma Immersion Ion Implantation and Deposition (MPIII&D) using a Newly Developed Plasma Source," Surface and Coatings Technology, vol. 200, Issues 1-4, Oct. 1, 2005, pp. 579-583.

Xu, et al., "Double glow plasma surface metallurgy and its applications," Plasma Surface Engineering Research and its Practical Applications, 2008: 355-379.

Wei, et al., "RF Plasma Enhanced Cylindrical Magnetron Sputter Deposition," 2008 Society of Vacuum Coaters, 51st Annual Technical Conference Proceedings, Chicago, IL, Apr. 19-24, 2008, pp. 559-564.

U.S. Appl. No. 11/397,878, filed Apr. 4, 2004, Chiang et al.

Rusch, "Tri-Service Green Gun Barrel (PP 1074)" Final Report, Mar. 31, 2003 (39 pages).

U.S. Office Action dated Aug. 13, 2010 issued in related U.S. Appl. No. 11/749,739.

U.S. Office Action dated Mar. 18, 2011 issued in related U.S. Appl. No. 11/749,739.

U.S. Appl. No. 11/749,739, filed May 16, 2007, Wei et al.

Chiang, et al. "Oxidation studies of Cu—Cr-coated Cu—Nb microcomposite" (5 pages), Published: 1993.

Chiang, et al. "Oxidation Kinetics of Cu-30vol.%Cr coating" (5 pages), Published: Dec. 4, 1994.

Chiang, et al. "Blanching resistant Cu—Cr coating by vacuum plasma spray" (6 pages), Published: 1995.

Malik, et al. "Development of an energetic ion assisted mixing and deposition process for TiNx and diamondlike carbon films, using a co-axial geometry in plasma source ion implantation" (5 pages), Published: Aug. 15, 1997.

Ensinger "An Apparatus for Sputter Coating the Inner Walls of Tubes" (4 pages), Published: Sep. 24, 1995.

Hosokawa, et al. "Self-sputtering Phenomena in High-rate Coaxial Cylindrical Magnetron Sputtering" (4 pages), Published : 1977.

Truszkowska, et al. "Cylindrical Magnetron Sputter Deposition of Chromium Coatings for Erosion and Wear Resistant Application" (7 pages), Published: Apr. 24, 2004.

Yee, et al. "Cylindrical Magnetron Sputtering in a Ferromagnetic Cylinder" (5 pages), Published: Apr. 24, 2004.

* cited by examiner

CONFORMAL MAGNETRON SPUTTER DEPOSITION

FIELD OF INVENTION

The present disclosure relates to a magnetron sputtering deposition apparatus and method for depositing a coating on the interior of a hollow substrate, wherein the target conforms to the interior of the substrate to be coated and where uniform coating thickness may be produced.

BACKGROUND

A number of copper based alloys, such as GRCop-84, NARloy-Z, or AMZIRC, have been studied for use in high heat flux structural applications, such as hypersonic vehicles and rocket engines, as the alloys may exhibit relatively high thermal conductivity and relatively high-temperature strength. A drawback of such alloys however has been rate at which these materials may oxidize at high temperature, which may ultimately cause deterioration of the alloys, otherwise known as blanching.

To enable or improve the use of these copper alloys at temperatures of up to about 650° C., protective coatings have been applied to shield the copper alloys from oxidation. Protective chromia scales, is an example of such coatings, and are similar to those formed on M-Cr alloys, wherein M may be either Ni, Co or Fe. The coatings may include Cu and Cr, wherein the Cr is present at about 30 volume percent. These coatings have been applied by plasma spray of a pre-alloyed powder as well as co-deposition of Cu—Cr using low temperature arc vapor deposition. A number coatings applied by the above methods have exhibited relatively coarse Cr particles having sizes in the range of 1 to 10 μm.

Nanostructured Cu—Cr coatings have been produced by ion-beam deposition (IBAD) by simultaneous or alternating evaporation from Cu and Cr sources. While this process may result in improved oxidation resistance and reduced particle size, the IBAD process may be considered to be a line-of-sight process, which may not be well suited for interior applications.

SUMMARY

In a first exemplary embodiment, the present disclosure relates to an apparatus for magnetron sputter coating of an interior surface of a hollow substrate defining at least one irregular contour. The apparatus may include a vacuum chamber and a target comprising one or more metals having an exterior surface also defining at least one irregular contour. The exterior surface of the target may then conform to at least a portion of an irregular contour of the interior surface of the hollow substrate to be coated. The apparatus may also include a magnet assembly wherein said magnets are positioned substantially within the target.

In a second exemplary embodiment, the present disclosure again relates to an apparatus for magnetron sputter coating. The apparatus may include a vacuum chamber and a hollow substrate having opposing interior surfaces and a longitudinal axis wherein a cross-sectional distance between the opposing surfaces varies between at least two locations along the hollow substrate longitudinal axis. A target may then be supplied having one or more metals having opposing external surfaces and a longitudinal axis wherein a cross-sectional distance between the target opposing surfaces varies between at least two locations along the target longitudinal axis. A magnet assembly may also be provided wherein the magnets are positioned substantially within the target and wherein an exterior surface of the target conforms to at least a portion of the interior surface of the hollow substrate.

In a third exemplary embodiment, the present disclosure relates to a method of depositing coatings onto the interior surface of a hollow substrate. The method includes providing a vacuum chamber and a hollow substrate having opposing interior surfaces and a longitudinal axis wherein a cross-sectional distance between the hollow substrate opposing surfaces varies between at least two locations along the hollow substrate longitudinal axis. A target may then be provided including one or more metals having opposing external surfaces and a longitudinal axis wherein a cross-sectional distance between the target opposing surfaces varies between at least two locations along the target longitudinal axis and wherein the exterior surface of the target conforms to at least a portion of said interior surface of said hollow substrate. A magnetic assembly may then be provided including magnets mounted on a magnet support including feeding of an inert gas into the vacuum chamber. This may then be followed by biasing the magnets and forming a plasma from at least a portion of the inert gas and forming a coating on the interior surface of said hollow substrate. The coating on the interior surface of the hollow substrate may be substantially uniform.

BRIEF DESCRIPTION OF DRAWINGS

The detailed description below may be better understood with reference to the accompanying figures which are provided for illustrative purposes and are not to be considered as limiting any aspect of the invention.

DETAILED DESCRIPTION

Figure 1A:
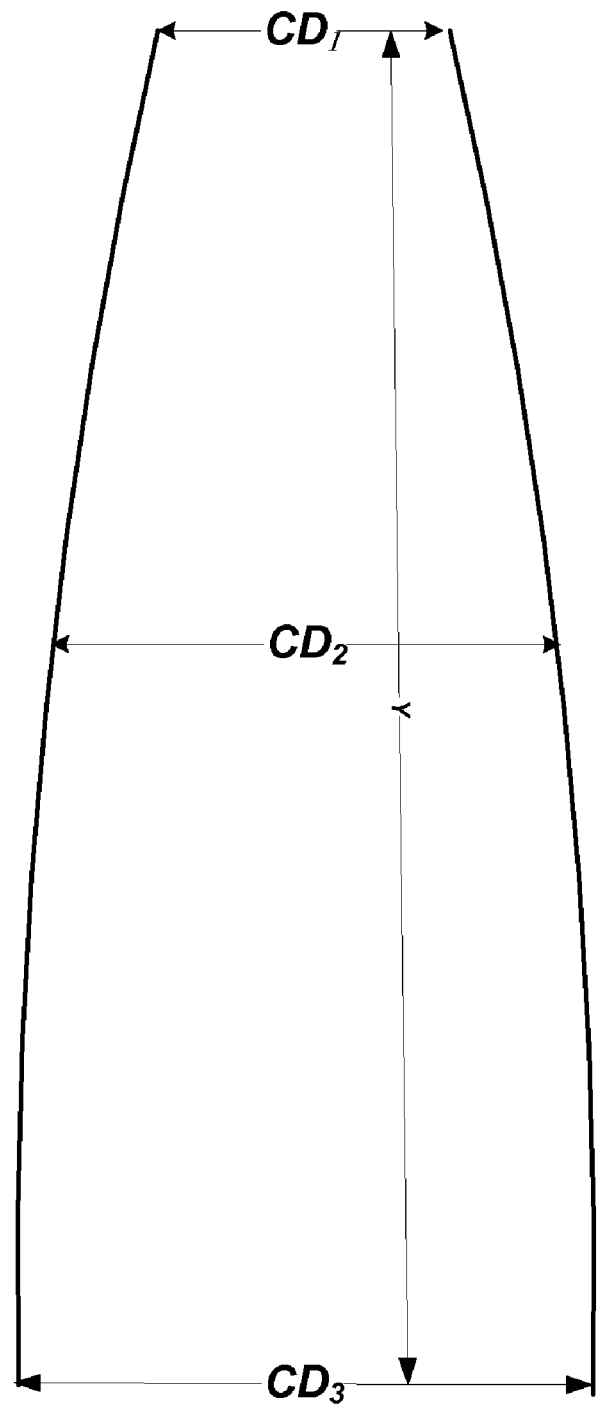
FIG. 1A is a cross-sectional schematic illustration of either the interior surface of a hollow substrate or the corresponding external surfaces of the target alloy, illustrating one type of irregular contour.
Figure 1B:
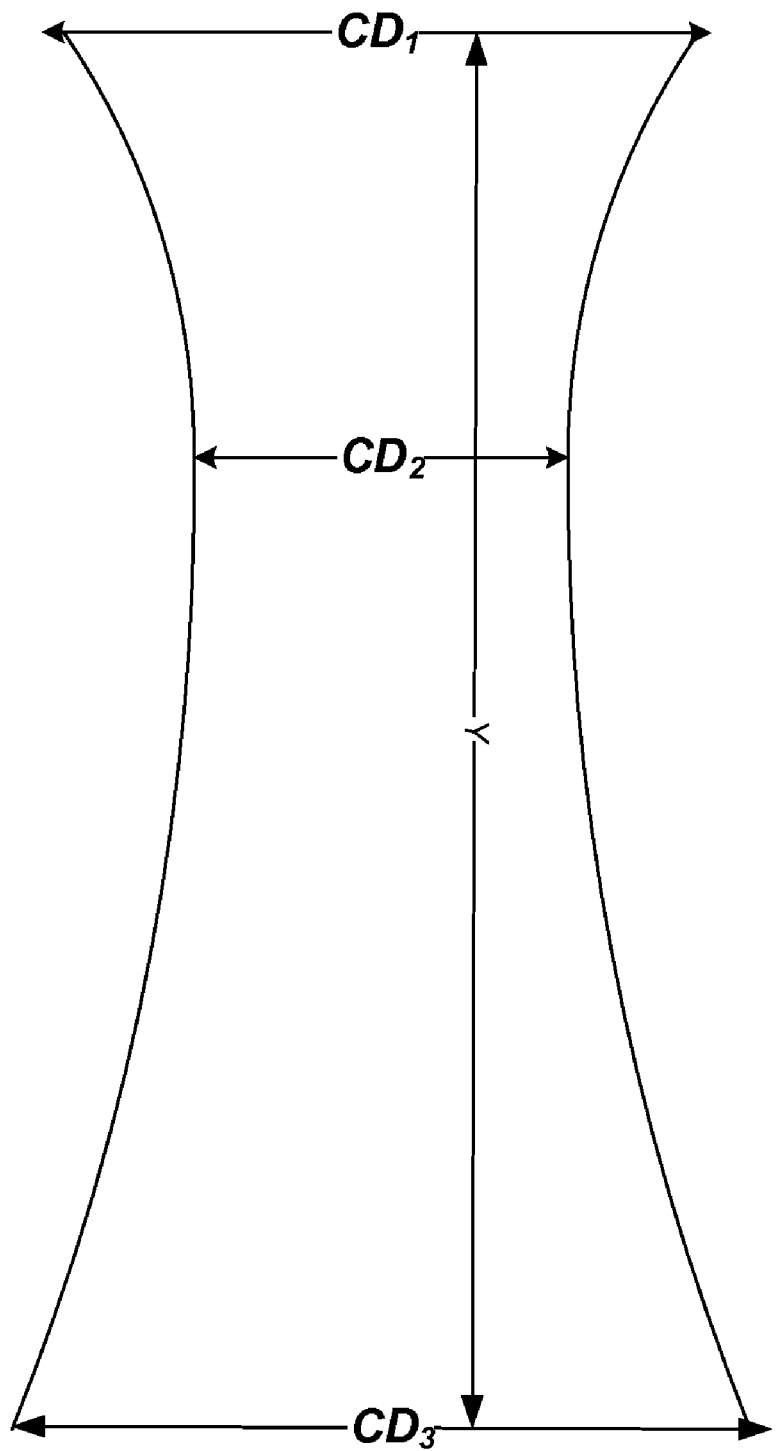
FIG. 1B is a cross-sectional schematic illustration of either the interior surface of a hollow substrate or the corresponding external surfaces of the target alloy, illustrating one type of irregular contour.

The subject matter herein relates to the deposition of a coating on an interior surface of a hollow substrate having irregular contours. The coating may be applied by magnetron sputtering, wherein the magnetron and its associated metallic alloy target material may be shaped to conform to the irregularly contoured hollow substrate interior surface. Irregular contours may therefore be understood herein as that situation where the cross-sectional dimensions of the hollow substrate or the target may vary between at least two or more points (locations) along the hollow substrate or target longitudinal axis. As illustrated in FIG. 1A, the interior cross-sectional dimensions $CD_1$, $CD_2$ and $CD_3$ are shown to vary along the longitudinal axis Y, wherein $CD_3 > CD_2$ and $CD_2 > CD_1$. FIG. 1B illustrates another example including interior cross-section dimensions CD1, CD2, and CD3 shown to vary along the longitudinal axis Y, wherein CD3>CD1 and CD1>CD2. Accordingly, the cross-sectional dimensions illustrated in FIG. 1A and FIG. 1B may define the distance between opposing interior surfaces of the hollow substrate or the distance between the opposing external surfaces of a given metallic target alloy associated with a given magnetron sputter coating apparatus.

Figure 1C:
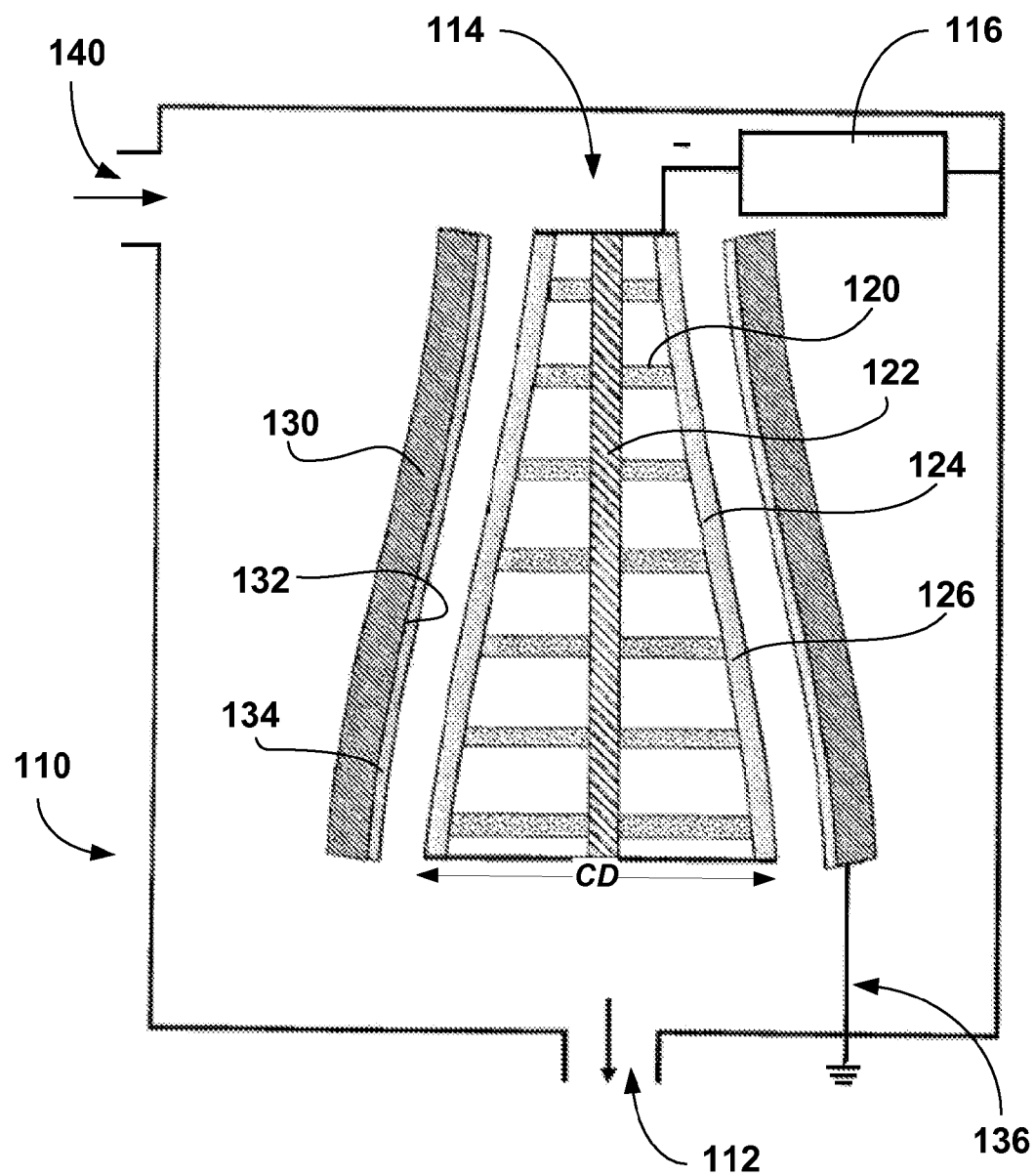
FIG. 1C is a cross-sectional schematic illustration of an exemplary magnetron sputtering system as contemplated herein.

FIG. 1C offers an example of a magnetron sputtering system wherein the cross-sectional dimension between the external surfaces of the target alloy 124 is identified as CD which also varies along the longitudinal axis as noted above. The system may generally include a vacuum chamber 110, a vacuum gas outlet 112, a magnetron 114 and a magnetron power supply 116. The magnetron 114 may include a number of magnets 120 mounted on a magnet support 122 and the target 124, which may be formed from one or more pieces. As FIG. 1C is a cross-section, it should be appreciated that the target 124 may be cylindrical thereby providing a surface that opposes the interior surface 132 of the hollow substrate 130. The hollow substrate 130 may be provided over and/or around at least a portion of the magnetron 114. As can be seen in FIG. 1C, the exterior surface 126 and/or shape of the target 124 may conform (see discussion below) to the irregular contour defined by the interior surface 132 of the hollow substrate 130 and therefore may, itself, include at least one irregular contour. In addition, a power source or ground 136 may be provided for biasing the interior surface 132 of the hollow substrate 130. Furthermore, the vacuum chamber may include a gas feed 140 for supplying an inert gas, wherein the inert gas may include argon, krypton, xenon and combinations thereof.

A target may be understood herein to conform to a substrate when the changes in the exterior cross-section of the target (e.g. outer diameter) correspond to changes in the interior cross-section of the hollow substrate along at least a portion of the length or longitudinal axis of the target and the substrate. In an exemplary embodiment, a distance "X" may be maintained between at least a portion of the exterior surface of the target and the interior surface of the hollow substrate having irregular contours. Accordingly, "X" may be relatively constant so that the distance between the exterior surface of the target and the interior surface of the substrate remains substantially the same along a portion of the longitudinal axis. For example, the value of X may vary no more than about +/−15% along at least a 10% portion of the longitudinal axis. In addition, the value of X may vary no more than about +/−15% along the entirety of the longitudinal axis. As discussed below, such relatively constant value of X may provide relatively uniform coating along the interior surface of the substrate. Accordingly, a coating may be provided to the interior surface of the hollow substrate that does not vary in thickness by more than +/−20% along all or a portion of the hollow substrate longitudinal axis, including all values and increments therein. For example, the coating may not vary in thickness by more than +/−1.0%, +/−2.0%, +/−3.0%, +/−4.0%, etc.

Figure 2:
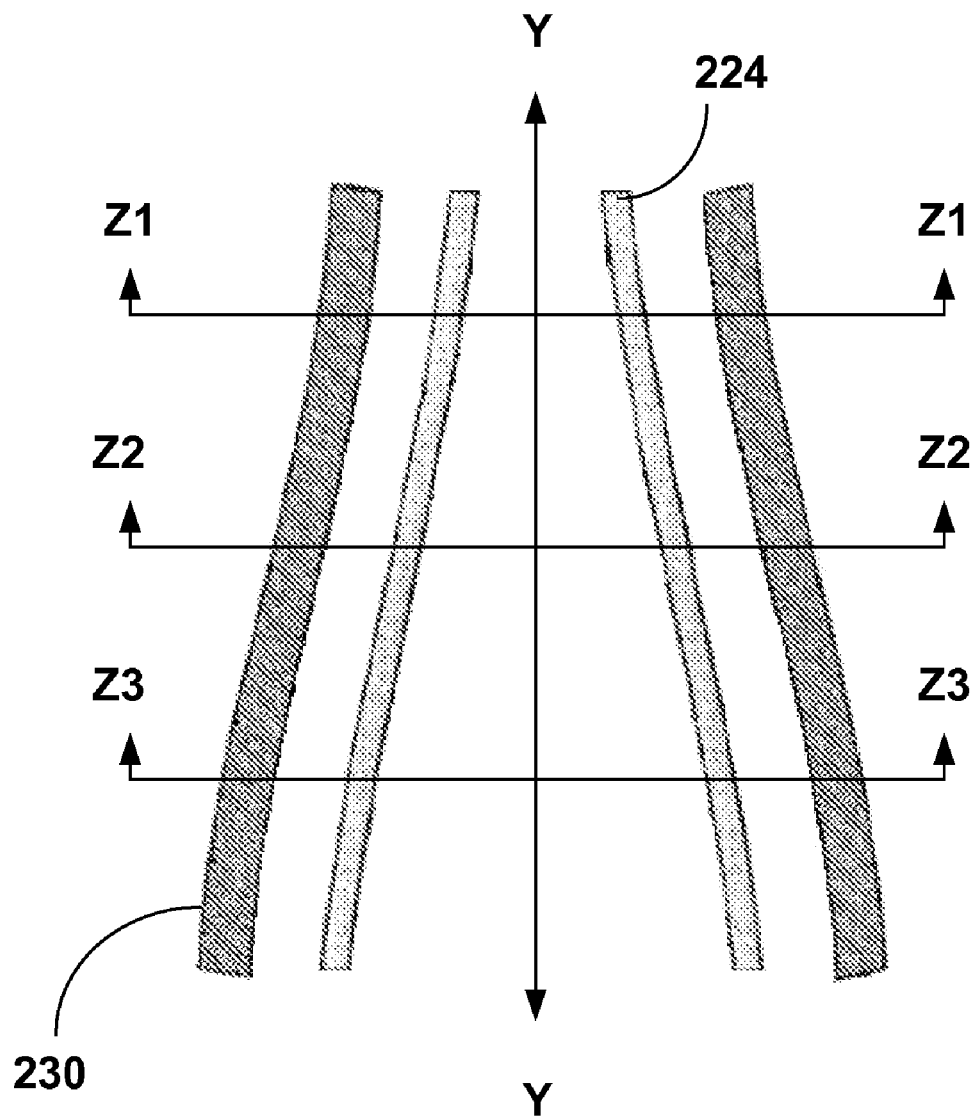
FIG. 2 is an exemplary schematic of a target and a substrate.
Figure 3A:
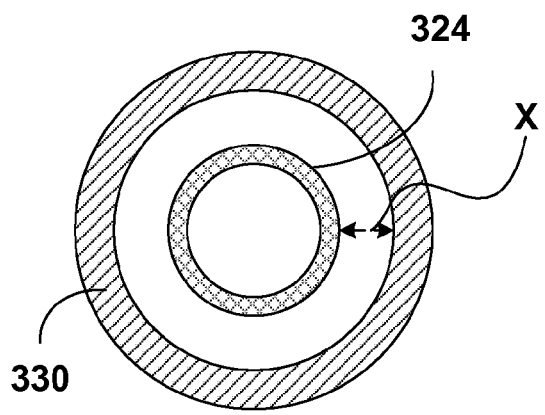
FIGS. 3a, b and c are exemplary cross-sectional view of the target and substrate of FIG. 2 taken at Z1-Z1, Z2-Z2 and Z3-Z3, respectively.
Figure 3B:
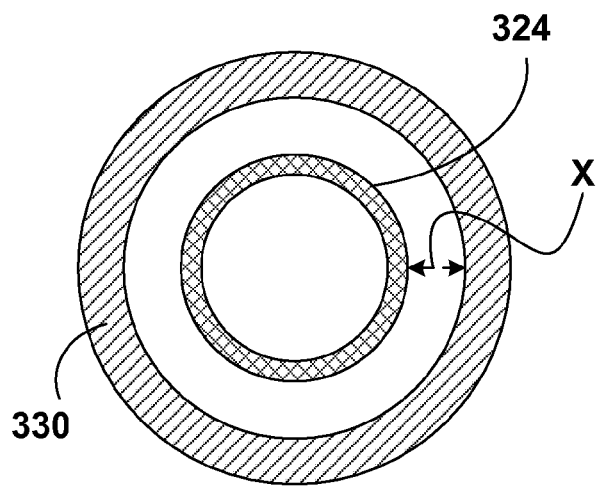
Figure 3C:
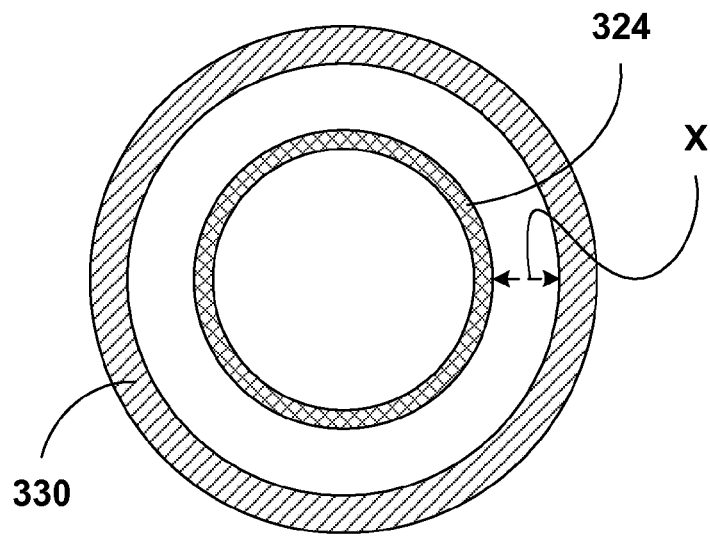
Figure 4:
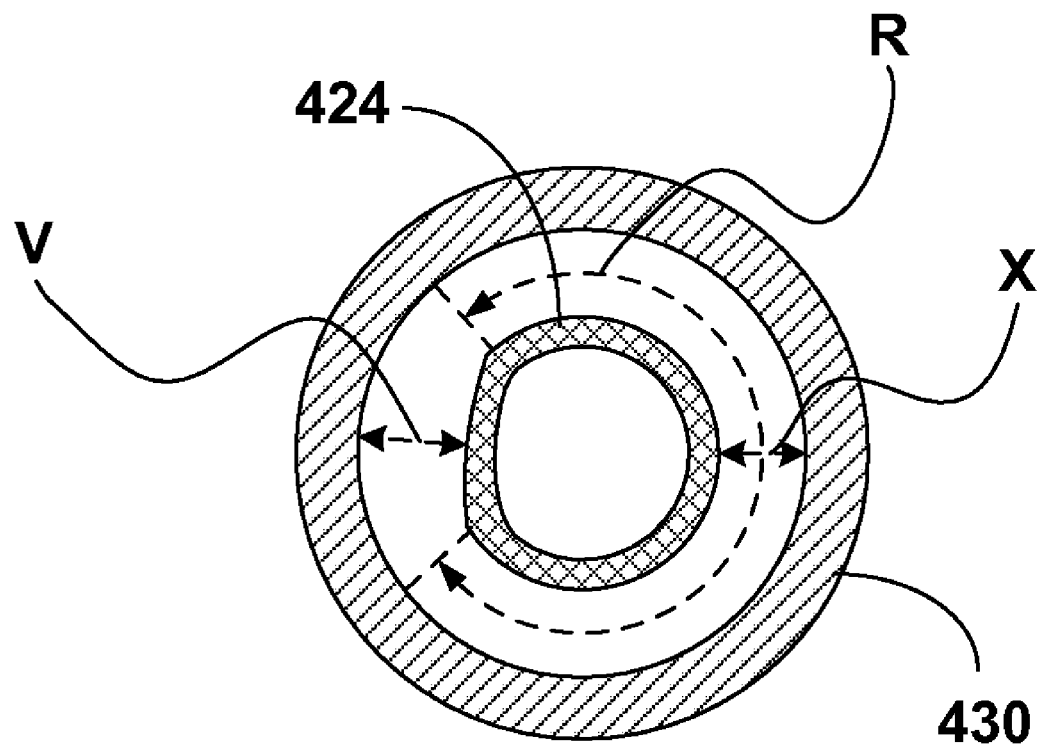
FIG. 4 is a schematic of an exemplary cross-sectional view of the target and substrate of FIG. 2 taken at Z1-Z1.

FIG. 2 illustrates an exemplary cross-section of conformal target 224 in relation to a given hollow substrate 230 along longitudinal axis Y-Y. FIGS. 3a, b and c next illustrate three cross-sections taken perpendicular to longitudinal axis Y-Y, i.e., Z1-Z1, Z2-Z2 and Z3-Z3 of FIG. 2, respectively, wherein the distance "X" between the conformal target 324 and the interior surface of the hollow substrate 330 may be maintained relatively constant or vary across the cross-sections. It should be appreciated, however, that the distance "X" need not be maintained along the entirety of the longitudinal axis Y-Y, but may be maintained along only a portion of the longitudinal axis Y-Y. FIG. 4 illustrates another exemplary embodiment of cross-section Z1-Z1 illustrated in FIG. 2. As therefore shown in FIG. 4, distance "X" need not be maintained along the entire circumference "C". The remainder may be a different distance, e.g., distance "V."

One exemplary conformal target herein may be provided by hot isostatic pressing of metallic alloy constituents into the desired form. Hot isostatic pressing may be understood as a process of applying both elevated temperature and isostatic gas pressure to the alloy composition forming the target, wherein the pressure is applied in all directions. The gas utilized may be an inert gas such as argon, a reducing gas such as hydrogen, or an argon-hydrogen mixture. Exemplary hot isostatic process conditions may include apply pressure in the range of about 5 to 50 ksi, including all values and increments therein, at a temperature of about 500° C. to 1500° C., including all values and increments therein, for a period of about 5 minutes to about 5 hours, including all values and increments therein.

The alloy constituents may also be supplied by a spray process to deposit the alloy constituents onto a preform of a given shape. The constituents of the alloy may be premixed prior to spraying or mixed during spraying and supplied as a powder. In an exemplary embodiment, KINETIC METALLIZATION, available from Inovati of Santa Barbara, Calif., may be utilized to deposit powders onto a preform. This process may be understood as a spray process wherein sufficient heat may be applied to the powder to provide ductility to the alloys and allow deformation of the alloys upon impact with the preform. However, bulk melting of the alloy, or constituents thereof, may not occur. The surface area of the deformed particle may be larger than the surface area of the sprayed particle, wherein the surface area of the deformed particle may be up to 600% greater, including all values and increments in the range of 10% to 600% greater, than the surface area of the sprayed particle. The preform may then be hot isostatic pressed to form a desired resultant target shape.

Figure 5:
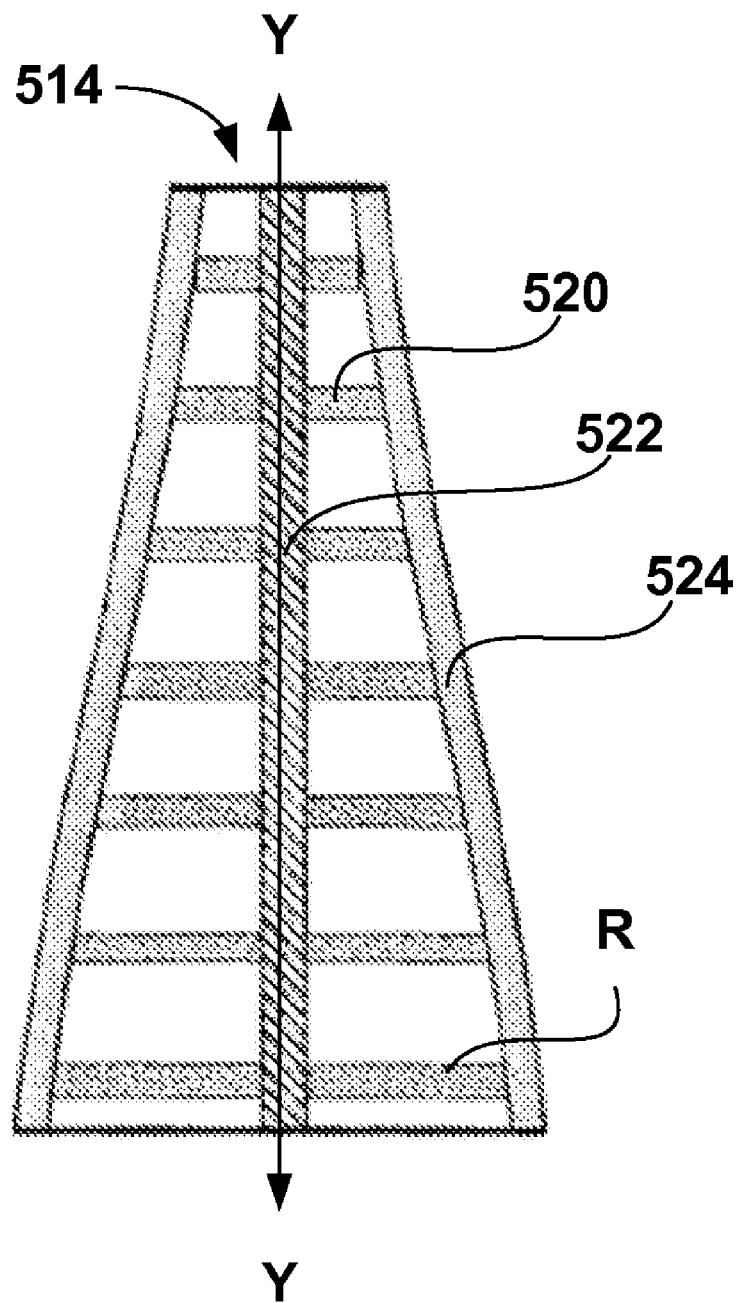
FIG. 5 is a schematic of an exemplary magnetron assembly.

As illustrated in FIG. 5, the magnetic assembly 514 of the magnetron, i.e., magnets 520 on magnet support 522, may be configured to accommodate the conformal shape of the target 524. In an exemplary embodiment, where the geometry of the cross-section of the target may be, for example, circular, the magnets may be ring shaped or a number of magnets may be arranged into a ring. In another exemplary embodiment the magnet may be rectangular, square, circular or any other shape and arranged so at to accommodate a desired cross-sectional configuration of the target. An even number of rows "R" of the magnets may be present and may lie circumferentially along the central, longitudinal axis Y-Y. Each row may have the same magnetic field polarity, which polarity may then alternate between adjacent rows. The magnet support structure 522, to which the magnets may be mounted may be composed of a ferrous material, such as iron or carbon steels.

The magnet assembly may also be rotated relative to the target utilizing a rotating drive system. The drive system may include a motor, a drive shaft, and a coupling connection with the magnetic assembly. The drive system may include a programmable logic controller for controlling the rotation of the magnets over the course of one or more sputter processes.

Figure 6:
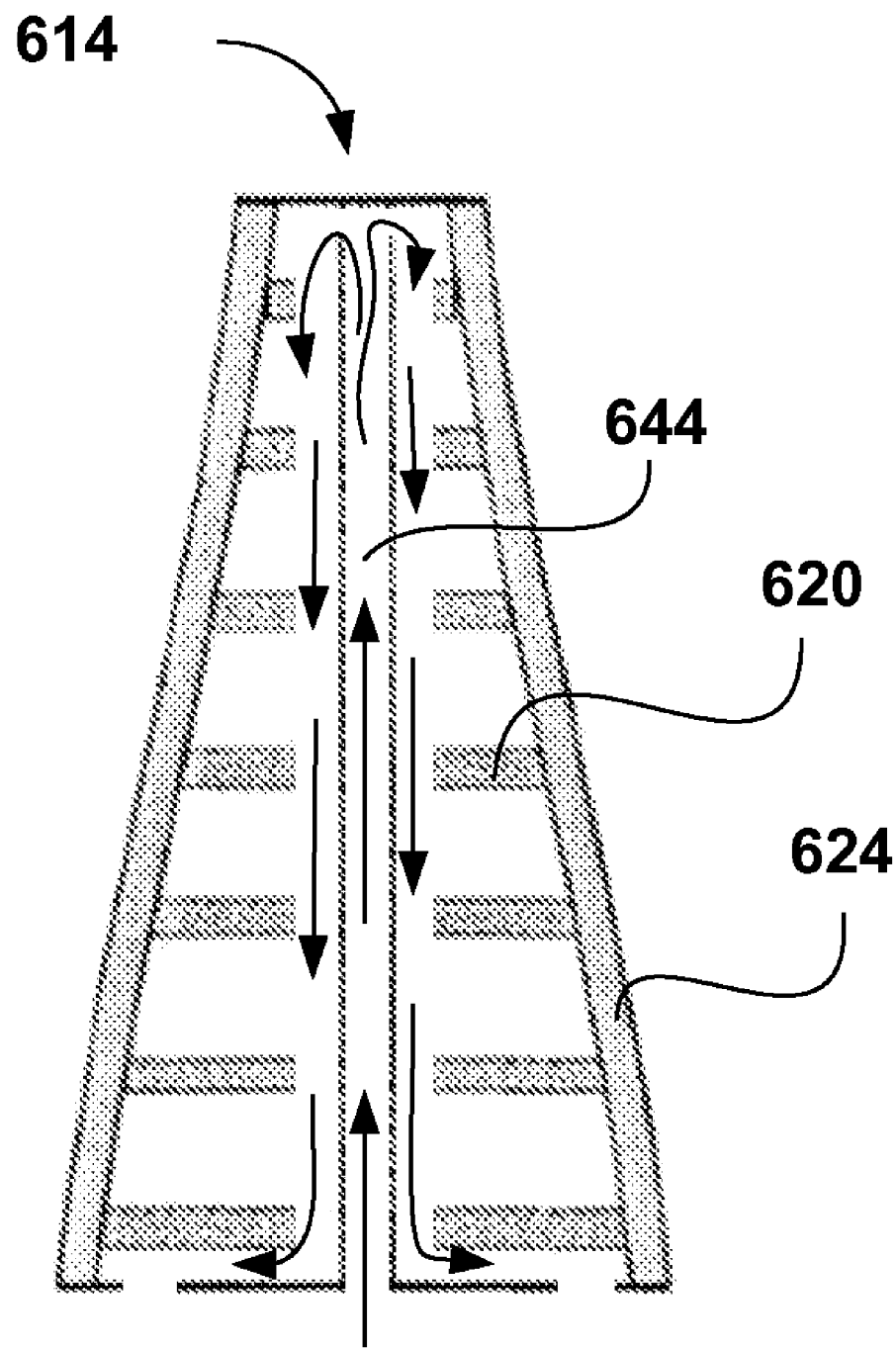
FIG. 6 is a schematic of an exemplary cooling system of a magnetron.

In addition, the magnetic assembly may include a cooling system, wherein heat may be drawn from the magnets, which may prevent demagnetization or melting of the magnetic material. FIG. 6 illustrates an exemplary cooling system, wherein the system may include one or more channels and/or baffles 644 to direct a fluid through the magnetron assembly and around or proximate to the magnets 620. The fluid may include, e.g., a gas, water, refrigerant solutions, or oil based composition. A description of such cooling system may be found in U.S. Pat. No. 6,767,436, the subject matter of which is incorporated herein by reference.

Figure 7:
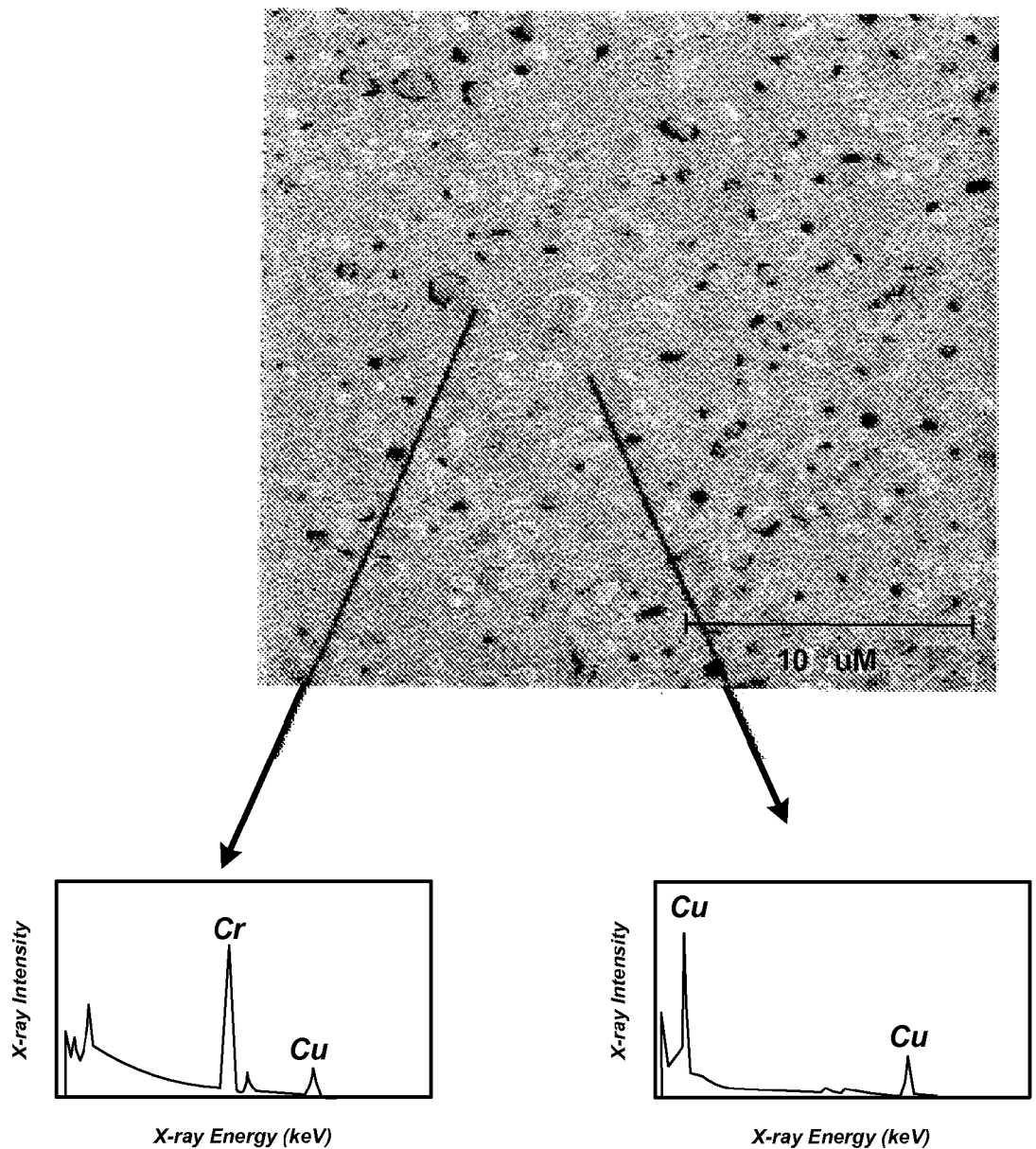
FIG. 7 is a picture of Cu and Cr microstructures of an exemplary target.

Coating compositions and target materials contemplated herein may include copper(Cu)-chromium(Cr) alloys, wherein the chromium is present in the range of about 5 to 25 weight percent, including all values and increments therein. The copper and chromium may be substantially pure, i.e., having a purity of greater than about 99.5 weight %, including all values and increments therein and in the range of 99.5 to 99.99 weight %. As noted above, the alloys may be formed prior to forming the target, upon forming the target or may be supplied by separate targets during the sputtering process. FIG. 7 illustrates a scanning electron micrograph of the Cu (21 wt. %-Cr) alloy target material produced by kinetic metallization of prealloyed Cu—Cr powders on a preform. The Cu—Cr composite target was then treated to hot isostatic pressure under 15 ksi at about 927° C. for about one hour. As can be seen from the corresponding energy dispersive x-ray analysis (EDX), the process provides relatively dense Cr particles in an essentially pure Cu matrix.

The Cu—Cr alloys may then be applied to various hollow substrate materials defining at least one irregular contour. In an exemplary embodiment, the hollow substrate materials may themselves include Cu based alloys, such as GRCop-84, including Cr present at about 8 atomic percent, Nb present at about 4 atomic percent and the remainder Cu, NARloy-Z, including Ag present at about 3 weight percent, Zr present at about 0.5 weight percent and the remainder Cu, AMZIRC, including Zr present at 0.1 to 0.2 weight percent and the remainder Cu, and other alloys including Cu present at least about 80 weight percent and at least one or more transition metals (elements in the d-block of the periodic table). As alluded to above, the copper alloys may be utilized in combustion chamber liners for rockets and other applications where the substrate may undergo relatively high temperature thermal cycling in the range of about 400 to 1,000° C.

While the sputter deposition process may vary with a given coating composition, the methodology for applying a coating on an interior surface of a hollow substrate defining irregular contours may be generally described, with reference back to FIG. 1. The substrate 130 and the magnetron 114, including the target 124 and magnetic assembly 120/122, may be positioned within the vacuum chamber 110. The chamber may be evacuated by one or more vacuum pumps (not illustrated) in fluid communication with the chamber through outlet 112 to a pressure in the range of $10^{-6}$ to $10^{-5}$ Torr, including all values and increments therein.

The sputtering process may include providing an inert gas into the vacuum chamber 110 by feed 140, which may be in fluid communication with an inert gas source, wherein the pressure in the chamber may be increased to a pressure in the range of about $10^{-4}$ to about $10^{-1}$ Torr, including all values and increments therein. The inert gas may include argon, krypton, xenon, etc., or combinations thereof. Optionally, the interior surface 132 of the hollow substrate may be sputtered cleaned prior to depositing the coating 134. To sputter clean, gas plasma may be formed by ionizing the gas, utilizing a secondary power source such as a filament, an RF or microwave source, etc.

To apply the coating, a voltage may be applied to the target and/or the substrate. The bias voltage may be applied to the target by the magnetron power supply 116 using RF, DC and pulsed DC sources. The bias voltage may be applied to the substrate by using DC or pulsed DC sources or the substrate may be grounded 136. Upon biasing the target, the inert gas may develop into a plasma, wherein positively charged ions forming a portion of the plasma may collide with the target and eject atoms from the target. The ejected atoms may then form a coating upon the interior surface of the hollow substrate. Electrons freed during the ion bombardment process may be confined by the magnetic field, generated by the magnets 120, and may contribute to further ionization of the inert gas by collisions with the gas atoms.

Figure 8:
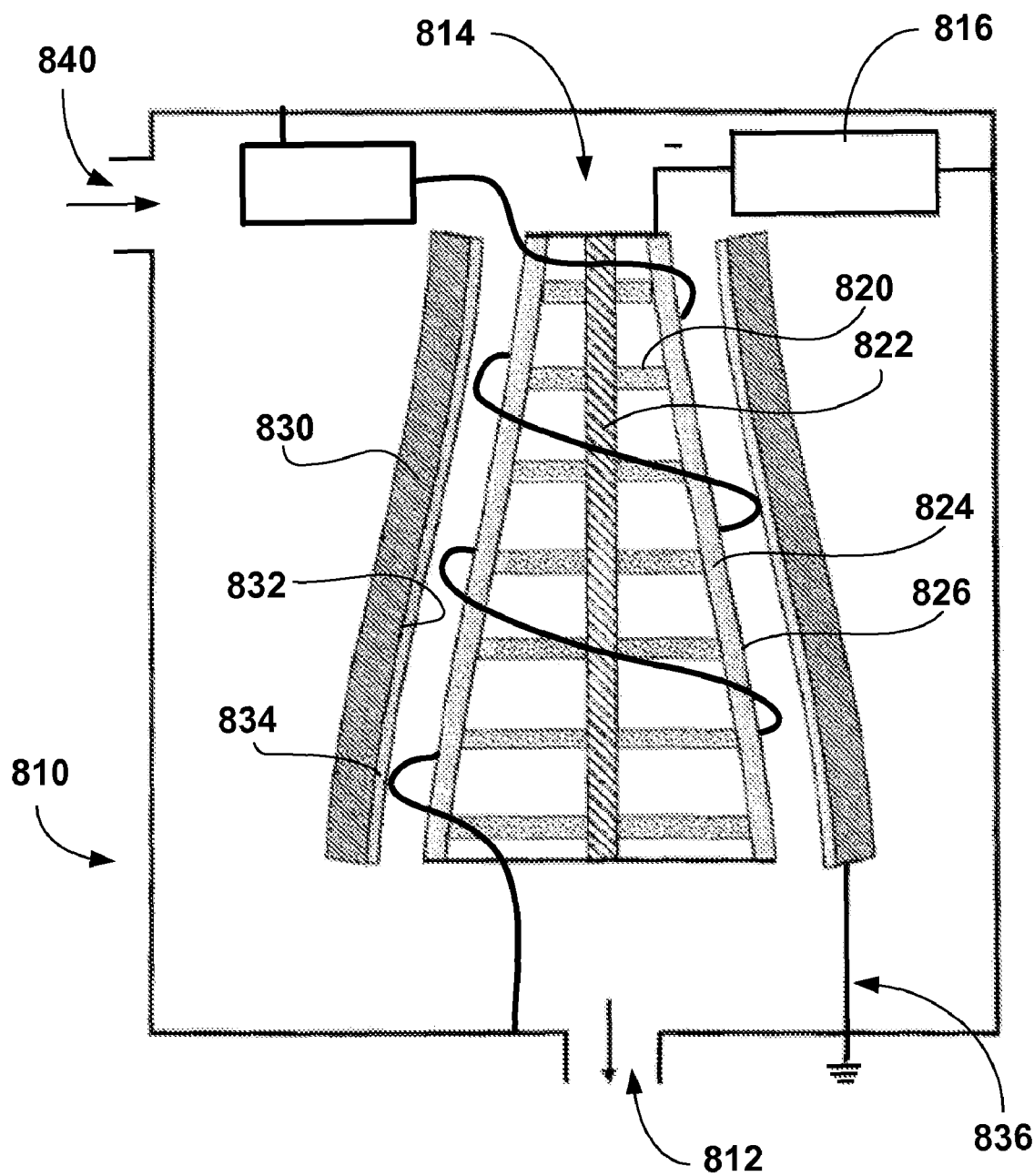
FIG. 8 is a schematic of an exemplary plasma enhanced magnetron sputtering system.

In a further embodiment, the magnetron sputtering may be plasma enhanced. That is, in addition to the magnetron, another or secondary electron source and a discharge power supply may be used to generate and further develop the plasma within the vacuum chamber. Such electron source may include a hot filament, an RF or microwave source, etc. For example, in an exemplary embodiment illustrated in FIG. 8, the electron source may be an RF antenna 850 powered by an RF power supply 852. The RF antenna 850 may be formed from a wire or a mesh and positioned around the magnetron. A description of such plasma enhanced magnetron sputtering techniques may be found in co-pending U.S. application Ser. No. 11/749,739, the subject matter of which is incorporated herein by reference.

A substantially uniform coating, having a thickness in the range of about +/−20%, may be formed along all or a portion of the irregularly contoured interior surface of the hollow substrate. The copper-chromium alloys, sputtered onto the hollow substrate may include nano-structured Cu—Cr phases, wherein the Cu—Cr phases are in the range of about 1 to 100 nm, including all values and increments therein. In addition, the size of the Cr particles may be less than 10 nm, including all values and increments in the range of 0.1 to 10 nm.

The foregoing description is provided to illustrate and explain the present invention. However, the description hereinabove should not be considered to limit the scope of the invention set forth in the claims appended here to.

What is claimed is:

1. A method of depositing coatings onto the interior surface of a hollow substrate comprising:
   providing a vacuum chamber;
   providing a hollow substrate having opposing interior surfaces and a longitudinal axis (Y) wherein a cross-sectional distance between said hollow substrate opposing surfaces varies between at least two locations along said hollow substrate longitudinal axis;
   providing a target comprising Cu—Cr alloys, wherein Cr particles are provided in a Cu matrix and Cr is present in the range of 5 to 25 weight percent, having opposing external surfaces and a longitudinal axis wherein a cross-sectional distance between said target opposing surfaces varies between at least two locations along said target longitudinal axis and wherein said exterior surface of said target conforms to at least a portion of said interior surface of said hollow substrate, and wherein said interior surface of said substrate and said exterior surface of said target are separated by a distance (X) wherein said distance (X) varies no more than +/−15% along the entirety of said target longitudinal axis;

providing a magnetic assembly including magnets mounted on a magnet support within said target including a secondary power source comprising a coil wrapped around said magnetic assembly;

feeding an inert gas into said vacuum chamber;

biasing said magnets and said secondary power source and forming a plasma from at least a portion of said inert gas;

forming a coating on said interior surface of said hollow substrate, wherein said coating has a thickness and said thickness does not vary by more than +/−20% along the entirety of said hollow substrate interior surface and said coating includes Cr particles in the range of 0.1 to 10 nm in size and said coating includes Cr present in the range of 5 to 25 weight percent; and wherein said hollow substrate, along said longitudinal axis (Y), has openings on each end of said hollow substrate, one of said openings with a cross sectional dimension ($CD_1$), an interior cross-sectional dimension ($CD_2$), and the other of said openings having a cross-sectional dimension ($CD_3$) wherein ($CD_1$) is less than ($CD_3$).

2. The method of claim 1, further comprising biasing said secondary power source and forming a plasma of said inert gas and sputter cleaning said substrate.

3. The method of claim 1, wherein said coating comprises Cu—Cr phases, wherein said phases are in the range of about 1 to 100 nm.

* * * * *